United States Patent [19]
Hamzehdoost et al.

[11] Patent Number: 5,742,009
[45] Date of Patent: Apr. 21, 1998

[54] PRINTED CIRCUIT BOARD LAYOUT TO MINIMIZE THE CLOCK DELAY CAUSED BY MISMATCH IN LENGTH OF METAL LINES AND ENHANCE THE THERMAL PERFORMANCE OF MICROELETRONICS PACKAGES VIA CONDUTION THROUGH THE PACKAGE LEADS

[75] Inventors: Ahmad Hamzehdoost, Sacramento; Chin-Ching Huang, Saratoga, both of Calif.

[73] Assignee: VLSI Technology Corporation, San Jose, Calif.

[21] Appl. No.: 541,213

[22] Filed: Oct. 12, 1995

[51] Int. Cl.$^6$ ................................................. H05K 1/16
[52] U.S. Cl. ........................ 174/260; 174/250; 174/256; 361/777; 361/748; 361/760; 361/767
[58] Field of Search ..................................... 174/250, 251, 174/261, 256, 260; 257/676, 695, 696; 361/777, 767, 783, 772, 748, 774, 750, 760

[56] References Cited
U.S. PATENT DOCUMENTS 5,428,505  6/1995  Sakemi et al. ......................... 361/777

Primary Examiner—Kristine L. Kincaid
Assistant Examiner—Hung V. Ngo
Attorney, Agent, or Firm—Patrick T. King

[57]  ABSTRACT

A printed circuit board layout is provided for minimizing signal delays caused by mismatch in length of the inner leads of a package lead frame. This is accomplished by the provision of a unique conductive trace pattern formed preferably on the top surface or else on a lower surface of an electrically-insulated, heat-conducting printed circuit board. The conductive trace pattern includes a plurality of U-shaped metallized traces. Each of the plurality of U-shaped traces have a varying length so that certain ones adjacent the inner leads at the center of the package lead frame are longer than certain ones adjacent the inner leads at the corners of the package lead frame. The conductive trace pattern and the outer leads of the package lead frame also serve to transfer heat away from a molded-plastic body encapsulating an integrated-circuit die and the package lead frame and distribute the same on the printed circuit board.

8 Claims, 3 Drawing Sheets

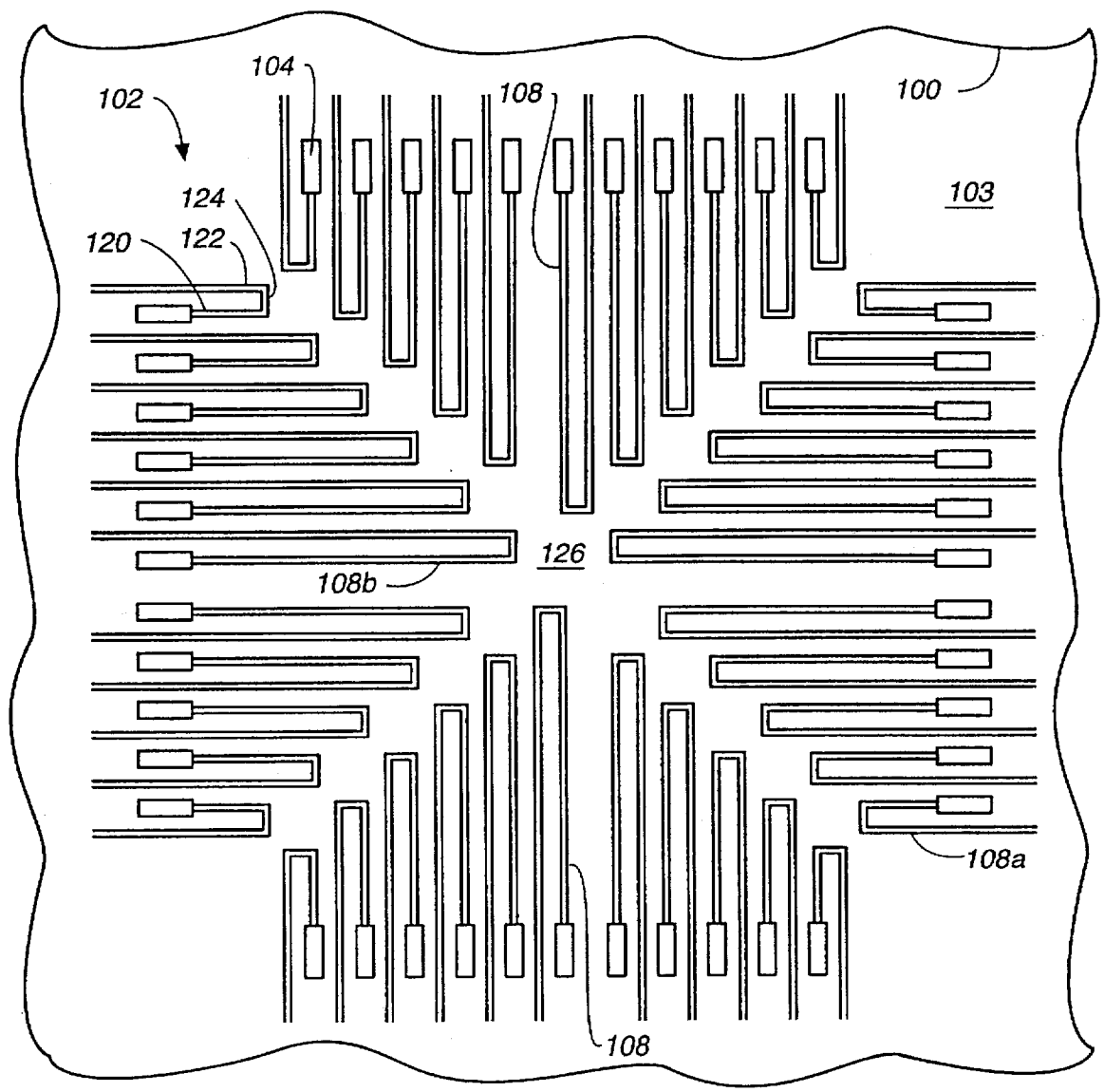
FIG._1

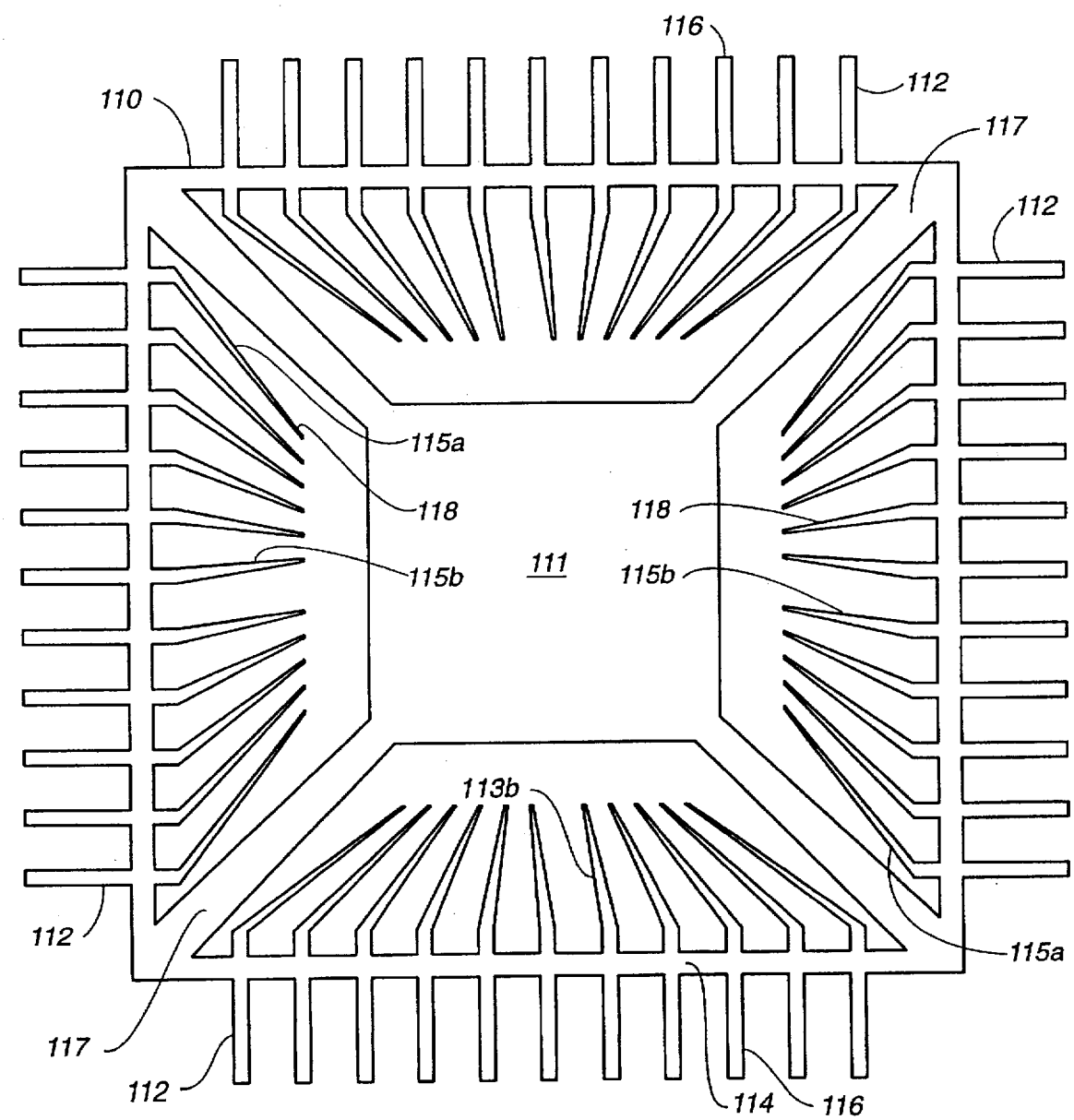
FIG._2

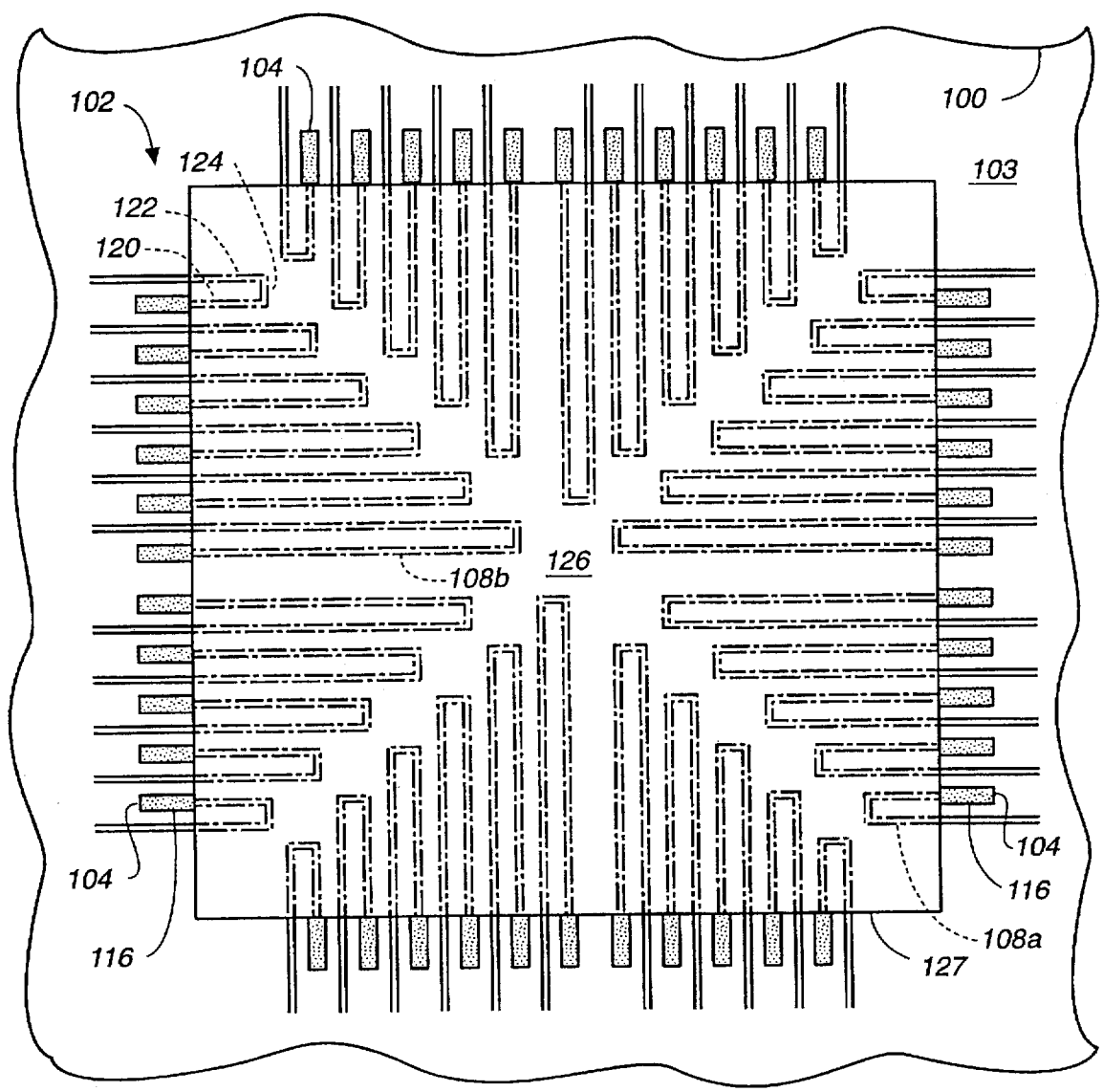
FIG._3

PRINTED CIRCUIT BOARD LAYOUT TO MINIMIZE THE CLOCK DELAY CAUSED BY MISMATCH IN LENGTH OF METAL LINES AND ENHANCE THE THERMAL PERFORMANCE OF MICROELETRONICS PACKAGES VIA CONDUTION THROUGH THE PACKAGE LEADS

BACKGROUND OF THE INVENTION

1. Field of the Invention

This invention relates generally to integrated circuit package assemblies and more particularly, it relates to a technique for minimizing signal delays caused by mismatch in length of metal lines on a conventional lead frame and a technique for enhancing the thermal performance of an integrated circuit package assembly via conduction through the package leads.

2. Prior Art

As is generally known in the art, an integrated circuit is formed on a small, substantially planar, piece of semiconductor such as silicon, known as a chip or die. The die generally contains a number of circuits therein and includes a plurality of bonding pads disposed on its top surface adjacent its peripheral edges. In a conventional molded quad flat pack (MQFP) package assembly, the integrated-circuit die is mounted to a centrally-located die-attach paddle or pad, of a thin metal lead frame which is typically stamped or chemically etched from strips of copper-containing materials. The die-attach paddle is rectangular in shape and is supported at each of its four corners by a radially extending support beam.

The lead frame includes a plurality of thin, closely-spaced conductive inner and outer leads which radially extend away from the edges of the die. Each inner lead is integrally connected to a corresponding outer lead. The inner leads are internally connected to corresponding bonding pads of the integrated-circuit die, using wire bonds. The outer leads diverge away from the die and extend through the exterior walls of the molded package where they form the external input/output (I/O) leads for the package assembly. These external leads are then formed to the desired configuration, such as a gull-wing shape, so that the package assembly is adapted to be bonded to bond pads on a printed circuit board (PCB).

The innermost ends of the conductive inner leads are called bonding fingers. Very thin gold bonding-wires have their one ends bonded to the corresponding bonding pads on the integrated-circuit die and their other ends bonded to the corresponding bonding fingers. However, due to the rectangular geometry of a die and the converging pattern of the conductive inner leads of the lead frame, the physical length of the conductive inner leads at the corner of the lead frame will always be longer then the length of the leads near the midpoint on the sides of the lead frame.

As a result, the inductance, which is directly proportional to the physical length of the conductive inner lead of the lead frame, will vary from the corner conductive leads to the center conductive leads. Consequently, this will create electrical signal delays between the different conductive leads and thus the time travel or signal speed through these leads will vary from lead to lead, causing a major problem in IC designs. In other words, at high speeds the signal on the center conductive lead of the lead frame will reach the end thereof first. After a certain amount of time delay, the same signal will reach the end of the corner conductive lead.

There are known in the prior art various methods for controlling the clock skew between clock output paths. However, these prior art methods utilize various sophisticated and complex electronic circuits in order to provide an adjustable delay, such as a phase locked loop network or a plurality of delay circuit elements. Thus, these solutions have not been very satisfactory. These prior art methods are more applicable at the die level and not at the package level.

Accordingly, there has arisen a need for an integrated-circuit packaging technique which can compensate for the differences in physical length of the various conductive leads of the lead frame so as to equalize the electrical signal delay between different conductive leads. Further, it would be expedient to provide an integrated-circuit technique which will permit enhanced thermal dissipation characteristics due to better heat transfer via conduction through the package leads of the integrated-circuit package assembly.

SUMMARY OF THE INVENTION

Accordingly, it is a general object of the present invention to provide an improved integrated-circuit packaging assembly which eliminates electrical signal delays between different conductive leads of a lead frame.

It is an object of the present invention to provide a method and apparatus for minimizing signal delays caused by mismatch in length of metal lines on a conventional lead frame.

It is another object of the present invention to provide a method and apparatus for enhancing the thermal performance of an integrated circuit packaging assembly via conduction through the package leads.

It is still another object of the present invention to provide an improved integrated circuit package assembly which includes a printed circuit board having a unique conductive trace pattern formed on its top surface so as to compensate for mismatch in length of the inner leads of a package lead frame. It is preferred that the conductive traces be on top for best thermal performance but they could be at lower levels within a printed circuit board structure.

It is yet still another object of the present invention to provide an improved integrated circuit package assembly which includes an electrically-insulated, heat-conducting printed circuit board having a plurality of U-shaped metallized traces being of varying length so that certain ones adjacent the inner leads at the center of the package lead frame are longer than certain ones adjacent the inner leads at the corner of the package lead frame.

In accordance with a preferred embodiment of the present invention, there is provided a printed circuit board layout for minimizing signal delays caused by mismatches in length of the inner leads of a package lead frame. An electrically-insulated, heat-conducting printed circuit board is provided which has a top surface. A plurality of bonding areas are disposed on the top surface of the printed circuit board in the footprint of a quad flat pack. A conductive trace pattern is formed on the top surface of the electrically-insulated, heat-conducting printed circuit board. The trace pattern includes a plurality of U-shaped metallized traces each having first and second ends.

The first ends are joined to a corresponding one of the plurality of bonding areas. The second ends extend outwardly from a central region of the printed circuit board so as to be proximate to a respective side edge of the quad flat pack. Each of the plurality of U-shaped traces is of a varying length so that certain ones adjacent the inner leads at the center of the package lead frame are longer than certain ones adjacent the inner leads at the corner of the package lead frame.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a top plan view of an electrically-insulated, heat-conducting printed circuit board having a unique conductive trace pattern, constructed in accordance with the principles of the present invention;

FIG. 2 is a top plan view of a conventional lead frame; and

FIG. 3 is a top plan view of the printed circuit board of FIG. 1 for a 44 MQFP package assembly with a conventional lead frame molded therein, illustrating the compensating technique of the instant invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

In FIG. 1, there is shown a portion of an electrically-insulated, heat-conducting printed circuit board (PCB) 100, having a unique conductive trace pattern 102 formed on its top surface 103, according to the present invention. A plurality of bonding pad areas 104 are formed in a rectangular configuration which is in the footprint of a molded quad flat pack (MQFP) packaging assembly having, for example, 44 package leads (outer leads or pins of the lead frame), with 11 package leads on each side of the rectangular package. It should be understood that the MQFP packaging assembly is formed of a molded-plastic body which has encapsulated therein an integrated-circuit die and an attached conventional lead frame. The outer leads of the lead frame extend through the exterior walls of the molded-plastic body so as to define the 44 package leads. The invention is not limited to a particular number of package leads.

Note also that the conductive trace pattern 102 could alternatively be formed at a lower level within a PCB on a patterned surface. The top surface of the PCB serves as the patterned surface in a preferred embodiment of the invention. Connection to the traces on a lower PCB level are made to the bonding pad areas 104 using plated through-hole or equivalent.

This conductive trace pattern 102 includes a plurality of U-shaped metallized traces 108 which are utilized to compensate for the differences in physical length between corner conductive leads and center conductive leads of a conventional lead frame 110 (FIG. 2).

Referring to FIG. 2, the lead frame 110 has a die-attach paddle portion 111, which is at its center thereof. An integrated-circuit die (not shown) is attached to the die-attach paddle portion 111. The lead frame 110 further includes a number of outer leads 112 extending from the four sides of the generally square lead frame. The entire assembly described is conventionally encapsulated in a molded plastic material, which forms the molded plastic body of the MQFP packaging assembly. A dam bar 114 interconnects all of the outer leads 112 and are eventually trimmed off to provide electrically discrete outer leads. The distal ends 116 of the outer leads 112 defining the package leads are then formed to the desired configuration, such as a gull-wing shape, so that they may be bonded to the bonding pad areas 104 on the printed circuit board 100 with the packaging assembly being supported over the conductive trace pattern 102.

A number of inner leads 115 extend inwardly of the outer leads 112 each of which terminates in a bonding finger 118 which are disposed peripherally surrounding the center of the lead frame. Each of the inner leads 115 is formed integrally with a corresponding one of the outer leads 112. The die-attach paddle portion 111 is secured in place at the center of the lead frame by tie bars 117. The tie bars 117 extend inwardly from the corners of the lead frame 110 and unlike the bonding fingers 118, are attached to the die-attach paddle portion 111.

It will be noted that the corner inner leads 115a are longer than the center inner leads 115b. Since the amount of inductance in the inner leads is directly proportional to its lead length, it will vary from the corner inner lead to the center inner lead. For instance, the difference in length between the inner leads 115a and 115b may cause additional inductance of 5 nH or more to exist in the longer corner leads, thereby resulting in different induced voltages in these two leads. Thus, when the same signal travels through these two leads, there will be created a significant signal delay therebetween due to this difference in length. This is a major concern to IC designers since this can cause a malfunction in the circuit operation.

In order to overcome this problem of signal delay, the inventor has developed a technique of minimizing the difference in length between the corner inner leads and the center inner leads so as to equalize the signal delay between any two leads. This is accomplished in the present invention by the provision of the conductive trace pattern 102.

With reference to FIGS. 1 and 3, each of the U-shaped metallized traces 108 includes a first elongated portion 120, a second elongated portion 122, and a short connecting portion 124 for joining one end of the first portion to one end of the second portion. The first end of each of the U-shaped metallized traces 108 is joined to a corresponding one of the plurality of bonding areas 104. The second ends of the U-shaped metallized traces 108 extend outwardly from a central portion 126 of the printed circuit board so as to be proximate to a respective side edge of the quad pack 127. The metallized traces 108 are deposited on the top surface or another lower surface of the printed circuit board 100 using thin-film deposition techniques or thick-film printing techniques where the printed circuit boards are made of epoxy-glass, FR4, ceramic, or similar or equivalent types of materials.

In particular, it will be noted that the first and second portions 120, 122 are longer adjacent the center of each side of the quad flat pack 127 and become shorter in length towards the corners of the quad flat pack 127. In this manner, the total length of each inner lead 115 on the lead frame 110 of FIG. 2 and its associated U-shaped metallized trace 108 will substantially all be the same length. As a result, all of the signal delays will be matched and will be made to be equal. For example, the total length of the corner inner lead 115a (FIG. 2) and the associated U-shaped metallized trace 108a (FIG. 1) will be equal to the total length of the center inner lead 115b (FIG. 2) and the associated U-shaped metallized trace 108b (FIG. 1).

In use, it will be understood that the quad flat pack 127 will be disposed and supported over the central portion area 126 of the printed circuit board 100 so as to overlie the conductive trace pattern 102. Since the area of the printed circuit board 100 underneath the quad flat pack 127 is typically not used in a very efficient manner, the trace pattern 108 of the metallized traces of the present invention has been designed so as to extend inwardly beneath the quad flat pack 127. Further, since the metallized conductive traces and the outer leads of the package lead frame (typically made of copper) are very good thermal conductors, they serve to transfer heat away from the package body and leads on the quad flat pack and distribute the same over the heat-conducting printed circuit boar PCB 100. These metal traces also act as a plane to which heat is radiated from a package body. As a result, the thermal resistance from junction to ambient $q_{jA}$ of a 208 MQFP package can be reduced by 5° to 10° C./W or approximately 15–30%, thereby improving the thermal performance of the integrated circuit package.

From the foregoing detailed description, it can thus be seen that the present invention provides a method and apparatus for minimizing signal delays caused by mismatch in length of metal lines on a conventional lead frame. This is accomplished by a plurality of U-shaped metallized traces disposed on the top surface of a printed circuit board so as to compensate for the differences in physical length between corner conductive leads and center conductive leads of a conventional lead frame. Further, the thermal performance of the integrated circuit package is improved by dissipating heat from the active surface of the molded package through the conductive trace pattern and the outer leads of the molded package.

What is claimed is:

1. A printed circuit board layout for minimizing signal delays caused by mismatch in the lengths of inner leads of a package lead frame, said layout comprising:

an electrically-insulated, heat-conducting printed circuit board having a top surface;

a plurality of bonding areas formed in a rectangular configuration and disposed on the top surface of said printed circuit board in a footprint of a quad flat pack;

a conductive trace pattern formed on the top surface of said printed circuit board, said trace pattern including a plurality of U-shaped metallized traces each of said traces having first and second ends;

said first ends being joined to a corresponding one of said plurality of bonding areas, said second ends extending outwardly from a central region of said printed circuit board so as to be proximate to a respective side edge of the quad flat pack; and each of said plurality of U-shaped metallized traces being of varying length so that certain ones adjacent the inner leads at the center of the package lead frame are longer than certain ones adjacent the inner leads at the corners of the package lead frame.

2. A printed circuit board layout as claimed in claim 1, wherein each of said plurality of U-shaped traces includes a first elongated portion, a second elongated portion, and a short connecting portion joining said first and second elongated portions together.

3. A printed circuit board layout as claimed in claim 1, further comprising a molded-plastic body encapsulating an integrated-circuit die and the lead frame, said molded-plastic body being mounted in the central region of the printed circuit board and overlying said conductive trace pattern on said printed circuit board so that said plurality of U-shaped traces extend inwardly beneath said molded-plastic body.

4. A printed circuit board layout as claimed in claim 1, wherein said printed circuit board is formed of a material having good heat conductive characteristics.

5. A printed circuit board layout as claimed in claim 4, wherein said printed circuit board is formed of a material selected from the group comprising ceramic, FR4, and epoxy-glass.

6. A printed circuit board layout as claimed in claim 1, wherein said conductive trace pattern is formed of a deposited thin-film material.

7. A printed circuit board layout as claimed in claim 1, wherein said trace pattern and outer leads of said package lead frame serve to transfer heat away from the outer leads and distribute the heat on the printed circuit board.

8. An integrated-circuit package configuration for packaging a molded-plastic body encapsulating an integrated-circuit die and a lead frame comprising:

an electrically-insulated, heat-conducting printed circuit board having a top surface;

a plurality of bonding areas formed in a rectangular configuration and disposed on the top surface of said printed circuit board in a footprint of a quad flat pack;

a conductive trace pattern formed on the top surface of said printed circuit board, said trace pattern including a plurality of U-shaped metallized traces each of said traces having first and second ends;

said first ends being joined to a corresponding one of said plurality of bonding areas, said second ends extending outwardly from a central region of said printed circuit board so as to be proximate to a respective side edge of the quad flat pack;

said lead frame having a plurality of inwardly-extending inner leads terminating in bonding fingers and having a center, said inner leads being disposed peripherally surrounding said center; and each of said plurality of U-shaped metallized traces being of varying length so that certain ones adjacent the inner leads at the center of the package lead frame are longer than certain ones adjacent the inner leads at the corners of the package lead frame.

* * * * *